Figure 1:
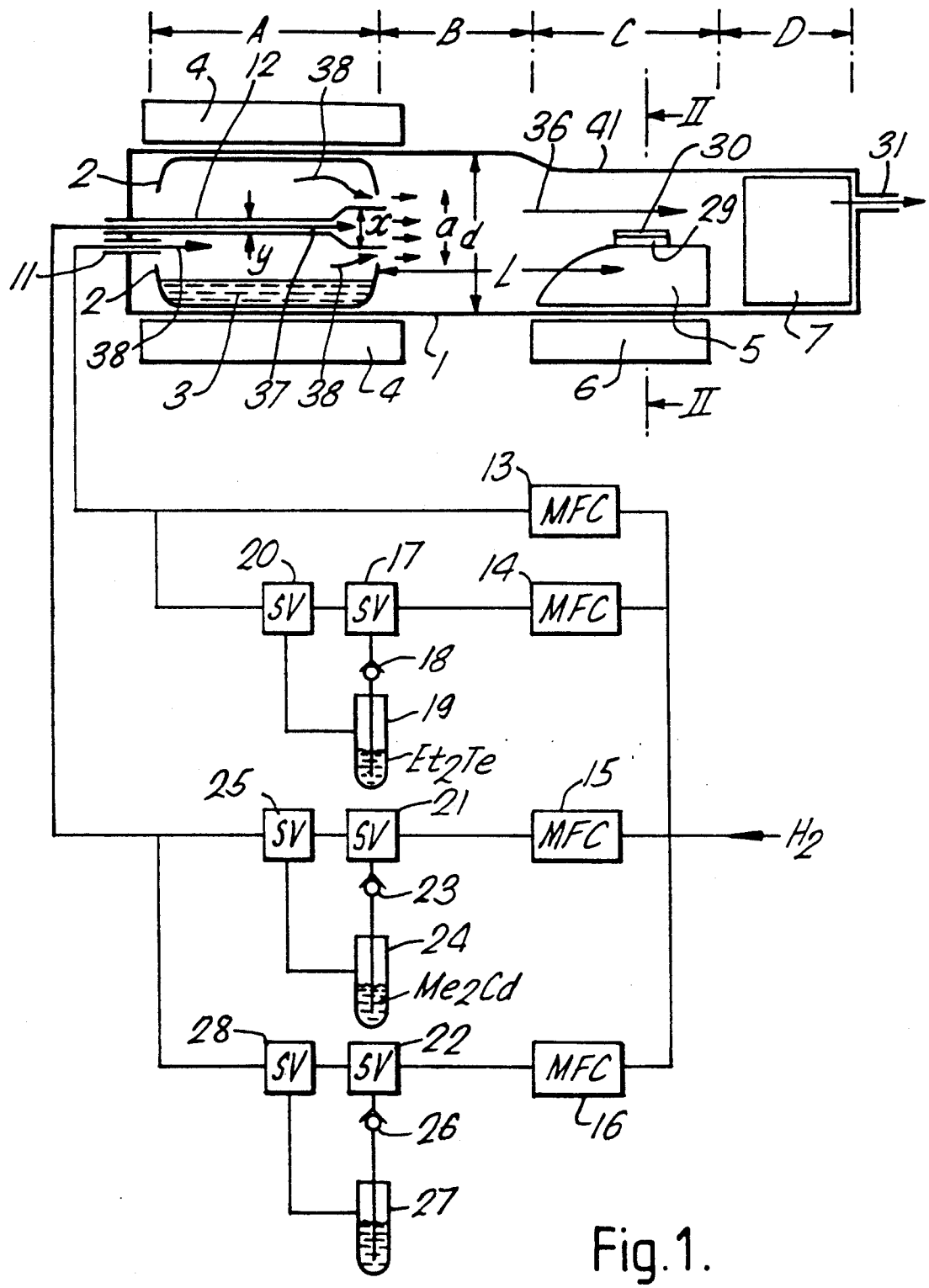

United States Patent [19]

Whiffin et al.

[11] Patent Number: 5,070,814
[45] Date of Patent: Dec. 10, 1991

[54] CVD REACTOR VESSEL FOR FORMING A SOLID STATE ELECTRONIC DEVICE

[75] Inventors: Peter A. C. Whiffin, Horsham; Christopher D. Maxey, Crawley, both of England; Brain C. Easton, Reigate, United Kingdom

[73] Assignee: U.S. Philips Corporation, New York, N.Y.

[21] Appl. No.: 609,967

[22] Filed: Nov. 6, 1990

Related U.S. Application Data

[60] Division of Ser. No. 497,746, Mar. 19, 1990, Pat. No. 4,992,303, which is a continuation of Ser. No. 276,706, Nov. 28, 1988, abandoned.

[30] Foreign Application Priority Data

Dec. 22, 1987 [GB] United Kingdom ............... 8729875

[51] Int. Cl.$^5$ .............................................. C23C 16/00
[52] U.S. Cl. ..................................... 118/715; 118/724
[58] Field of Search .............................. 118/724, 715; 427/126.1, 58, 255.1, 255.2

[56] References Cited

U.S. PATENT DOCUMENTS 4,220,488 9/1980 Duchemin et al. ............... 148/175

FOREIGN PATENT DOCUMENTS

068839A1 5/1983 European Pat. Off. .
1-143579 7/1986 Japan .
2156857A 10/1985 United Kingdom .

Primary Examiner—Shrive Beck
Assistant Examiner—Roy V. King
Attorney, Agent, or Firm—Paul R. Miller

[57] ABSTRACT

A CVD reactor vessel for forming a solid state electronic device comprising (a) a reaction zone laterally separated from a first zone, (b) support means for supporting a substrate in said reaction zone, (c) heating means for heating both said first zone and said reaction zone, (d) first supply means for supplying at least one first reactant into a gas stream flowing from said first zone to said reaction zone, and (e) second supplying means for supplying at least one second reactant into said gas stream between said first zone and said reaction zone, said second supply means including an injection tube extending through said first zone to a location between said first zone and said reaction zone, said injection tube having a widened outlet so that the flow velocity of said second reactant more closely matching the flow velocity of said gas stream, wherein said substrate receives a layer of material such as cadmium mercury telluride formed from said reactants.

9 Claims, 2 Drawing Sheets

CVD REACTOR VESSEL FOR FORMING A SOLID STATE ELECTRONIC DEVICE

This application is a divisional application of previous parent application Ser. No. 497,746, filed Mar. 19, 1990, now U.S. Pat. No. 4,992,303 which itself is a continuation of previous application Ser. No. 276,706, filed Nov. 28, 1988 now abandoned, and all benefits of such earlier applications are hereby claimed for this new divisional application.

This invention relates to methods of manufacturing electronic devices in which a gas stream comprising at least first and second reactants is passed over a heated substrate in a reaction zone of a reactor vessel so as to deposit material in a layer on the substrate. The invention relates particularly but not exclusively to the deposition of material for a layer of cadmium mercury telluride using, for example, alkyls of cadmium and tellurium. The devices fabricated from the layer may be, for example, photoconductive infrared detectors, photodiodes or bipolar transistors.

Published United Kingdom patent application GB-A-2 156 857 discloses a method of manufacturing a device comprising cadmium mercury telluride, in which a mercury source is heated in a first zone of a reactor vessel to maintain an atmosphere of mercury vapour in a second, reaction zone of the reactor vessel; a gas stream comprising a volatile tellurium compound (for example diethyl telluride) and a volatile cadmium compound (for example dimethyl cadmium) is passed over a heated substrate in the reaction zone in the presence of the mercury vapour so as to deposit material for a layer of cadmium mercury telluride on the substrate; the volatile cadmium compound is supplied to the reaction zone separately from the volatile tellurium compound by means of an injection tube which passes in the reactor vessel through the first zone so as to inject the volatile cadmium compound into the gas stream at a location between the mercury source and the substrate; the tube has a narrow bore to provide a high flow velocity for the cadmium compound through the first zone. By abruptly changing the flow-rate of the volatile cadmium compound by means of a control valve, abrupt changes in the composition of the deposited material can be obtained in the direction of thickness of the layer.

With the particular system disclosed in GB-A-2 156 857, the reactor vessel is a tube having an internal diameter of 40 mm, and the overall flow velocity of the gas stream over the substrate is typically 5 to 8 cm.s$^{-1}$ (centimeter per second). The internal diameter of the injection tube (including its outlet into the reaction zone of the vessel) is of the order of 1 mm, and the flow velocity of the volatile cadmium compound (for example more than 150 cm.s$^{-1}$ for dimethyl cadmium) is such that no significant decomposition of the cadmium compound occurs until it arrives in the hotter reaction zone. Thus, although the first zone of the reactor is heated to, for example, 220° to 250° C. (degrees Celsius) to generate the mercury vapour, the cadmium alkyl is isolated from the mercury vapour in the first zone by the injection tube and is passed rapidly therethrough to the reaction zone. A dopant for the deposited layer may also be supplied to the reaction zone by means of the injection tube so as not to contaminate the mercury source in the first zone. Thus, the system disclosed in GB-A-2 156 857 provides considerable advantages in the provision of cadmium mercury telluride.

Further work by the applicants has shown that significant variations in the composition of the deposited material can occur at different locations on the surface of the substrate. There is a tendency for the cadmium content of the deposited material to decrease with distance along the reaction zone due to the higher reaction rate of the cadmium compound as compared with the mercury compound. However, the present invention is based on a recognition that some of the variation in composition is of a local nature due to unbalanced mixing of the cadmium supply with the other reactants in the gas stream over the substrate, and that an improvement can be obtained by matching more closely the flow velocities of the cadmium supply from the injection tube and of the main gas stream. Similar situations can occur in the growth and doping of materials other than cadmium mercury telluride, for example with other ternary materials such as cadmium zinc telluride or binary semiconductor materials such as gallium arsenide.

According to a first aspect of the present invention there is provided a method of manufacturing an electronic device in which a gas stream comprising at least first and second reactants is passed over a heated substrate in a reaction zone of a reactor vessel so as to deposit material in a layer on the substrate, the first reactant being supplied to the reaction zone separately from the second reactant by means of an injection tube which passes in the reactor vessel through a heated first zone of the vessel so as to inject the first reactant into the gas stream at a location between the first zone and the substrate, the tube having a narrow bore to provide a high flow velocity for the first reactant through the first zone, characterised in that the tube has the narrow bore over most of its length in the first zone and then, towards its outlet end, the tube widens in at least one dimension so as to provide an unobstructed wider outlet for injecting the first reactant into the gas stream with a lower flow velocity which matches more closely the flow velocity of the gas stream at the location.

According to a second aspect of the present invention there is provided a method of manufacturing an electronic device comprising cadmium mercury telluride, in which a mercury source is heated in a first zone of a reactor vessel to maintain an atmosphere of mercury vapour in a second, reaction zone of the reactor vessel, and a gas stream comprising a volatile tellurium compound and a volatile cadmium compound is passed over a heated substrate in the reaction zone in the presence of the mercury vapour so as to deposit material for a layer of cadmium mercury telluride on the substrate, the volatile cadmium compound being supplied to the reaction zone separately from the volatile tellurium compound by means of an injection tube which passes in the reactor vessel through the first zone so as to inject the volatile cadmium compound into the gas stream at a location between the mercury source and the substrate, the tube having a narrow bore to provide a high flow velocity for the cadmium compound through the first zone, the method being characterised in that the tube has a narrow bore over most of its length in the first zone and then, towards its outlet end, the tube widens in at least one dimension so as to provide an unobstructed wider outlet for injecting the volatile cadmium compound into the gas stream with a lower flow velocity which matches more closely the flow velocity of the gas stream at this location.

It may be noted that it is already known to widen a gas supply tube along a heated length of a reactor vessel so that it can accommodate a source of a less volatile constituent of material to be deposited. When the material to be deposited is gallium arsenide, the source accommodated in the tube is gallium; arsenic trichloride or other reactive gas (diluted by a carrier gas) is passed through the tube and hence over the gallium source. United Kingdom patent specifications GB-A-1 341 787 and GB-A-1 481 477 disclose arrangements in which the gas supply tube narrows again after the gallium source so as to form a narrow outlet to the reaction zone. European patent applications EP-A-0 068 839 and EP-A-0 037 199 disclose arrangements in which the gas supply tube widens upon entering the first heated zone of the reactor vessel. In all these arrangements the flow of the reactive gas through the tube is obstructed and disturbed by the presence of the source in the widened length of the tube. By contrast therewith, the injection tube in accordance with the present invention has a narrow bore over most of its length through the first heated zone of the vessel so as to provide a high flow velocity in this zone and widens towards its outlet end so as to provide an unobstructed wider outlet for injecting the first reactant into the gas stream with a lower flow velocity more closely matching that of the gas stream at that location.

In accordance with the present invention, so as to obtain a more symmetrical gas flow pattern with better mixing at the wide outlet of the injection tube, it is advantageous when the arrangement is such that in the first zone the gas stream flows through a capsule containing a source of a reactant, and that the cross-section of the capsule narrows towards at least one end to provide the capsule with an outlet of smaller cross-sectional area, and that the outlet of the injection tube is concentrically arranged within the outlet of the capsule. In the growth of cadmium mercury telluride, the source of mercury in the first zone may be a pool of mercury contained in the capsule. This provides a container enabling the mercury to be more easily moved into reactor vessel.

Furthermore the arrangement is preferably such that a mixing zone is present between the first zone and the reaction zone, and the mixing zone preferably has a larger cross-sectional area than that of the outlet of the capsule and that of the reaction zone over the substrate. The expansion of the reactants from the injection tube and the capsule into this mixing zone of larger cross-sectional area seems to provide particularly efficient mixing of the gas flows.

In order to stabilize the mixed gas stream before deposition on the substrate, the wide outlet of the injection tube is preferably spaced from the heated substrate by a distance along the reactor vessel, which distance is at least 2 times the average cross-sectional dimension of the reactor vessel at that location.

According to a further aspect of the invention there is provided a reactor vessel having a reaction zone preceded by a first zone, support means for supporting a substrate in the reaction zone, heating means for heating the first zone and the reaction zone, respective first and second supply means for supplying a first reactant and a second reactant in a gas stream to the reaction zone, the first supply means comprising an injection tube which passes in the reactor vessel through the first zone of the vessel so as to inject the first reactant into the gas stream at a location between the first zone and the substrate, the tube having a narrow bore to provide a high flow velocity for the first reactant through the first zone, the reactor vessel being characterised in that the tube has a narrow bore over most of its length in the first zone and then, towards its outlet end, the tube widens in at least one dimension so as to provide a wider outlet for injecting the first reactant into the gas stream with a lower flow velocity which matches more closely the flow velocity of the gas stream at this location.

Figure 2:
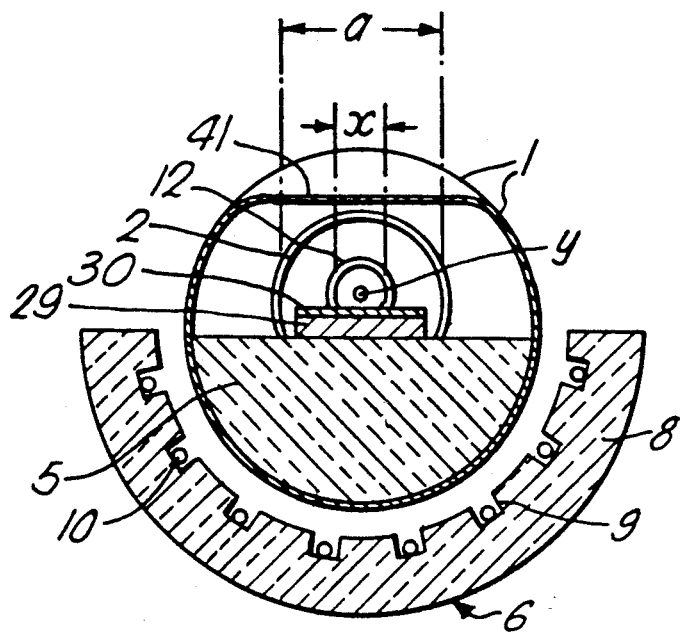
Figure 3:
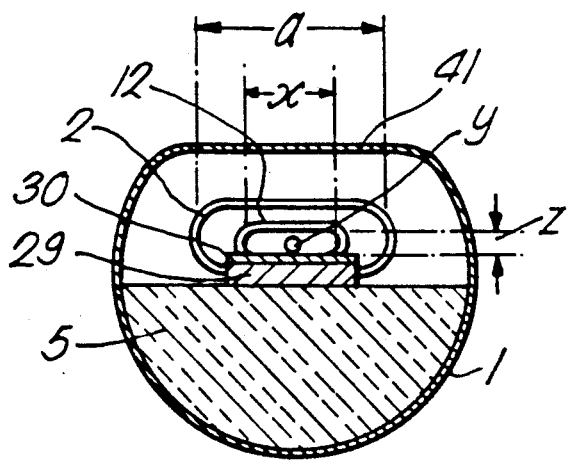

These and other features in accordance with the invention are illustrated in specific embodiments of the invention now to be described with reference to the accompanying diagrammatic drawings, in which:

FIG. 1 is a schematic representation of a longitudinal section through a reactor vessel in accordance with the invention, together with a schematic representation of a gas supply system for use of the reactor vessel in a method in accordance with the invention, FIG. 2 is a cross-sectional view on the line II—II of FIG. 1, and FIG. 3 is a cross-sectional view at a similar position in a differently shaped reactor vessel in accordance with the invention.

It should be noted that the drawings are diagrammatic and not drawn to scale. The relative dimensions and proportions of parts of these Figures have been shown exaggerated or diminished in scale for clarity and convenience in the drawings. The same reference signs as used in one embodiment are generally used when referring to corresponding or similar parts in other embodiments.

FIGS. 1 and 2 illustrate one example of an embodiment of the present invention in the manufacture of an electronic device comprising cadmium mercury telluride. A mercury source 3 is heated in a first zone A of a reactor vessel 1 to maintain an atmosphere of mercury vapour in a second, reaction zone C of the reactor vessel. A gas stream 36 comprising a volatile tellurium compound (e.g. diethyl telluride $Et_2Te$) and a volatile cadmium compound (e.g. dimethyl cadmium $Me_2Cd$) is passed over a heated substrate 29 in the reaction zone C in the presence of the mercury vapour so as to deposit material for a layer 30 of cadmium mercury telluride on the substrate 29. The volatile cadmium compound is supplied to the reaction zone C in a gas stream 37 separately from the volatile tellurium compound in a gas stream 38. This is achieved by means of an injection tube 12 which passes in the reactor vessel 1 through the first zone A so as to inject the volatile cadmium compound into the gas stream 38, 36 at a location between the mercury source 3 and the substrate 29. The tube 12 has a narrow bore y to provide a high flow velocity for the cadmium compound through the first zone A.

In accordance with the present invention the tube 12 has this narrow bore y over most of its length in the first zone A and then, towards its outlet end, the tube 12 widens in both dimensions x and z in this embodiment so as to provide a wider outlet for injecting the cadmium compound into the gas stream 38, 36 with a lower flow velocity which matches more closely the flow velocity of the gas stream 38, 36 at that location.

The reactor vessel illustrated by way of example in FIGS. 1 and 2 comprises a silica tube 1 having four zones A, B, C and D. Zones A and B are of circular cross-section having an internal diameter of, for example, about 40 mm, whereas the zones C and D are of smaller cross-section having a flat upper wall 41.

In the first zone A, a pool of the mercury 3 is contained in a hollow-cylindrical capsule 2 having an inlet at one end and an outlet at the opposite end so that the gas stream 38 from tube 11 flows therethrough. These inlet and outlet are of smaller cross-sectional area (diameter a) than the main body of the capsule 2. The capsule 2 containing the mercury 3 may be heated by a tubular resistance furnace 4. The wide outlet (diameter x) of the injection tube 12 is concentrically arranged within the narrowed outlet of the capsule 2, as illustrated in FIGS. 1 and 2, so that the flow 38 is symmetrically constricted around the outlet of tube 12. The widening of the tube 12 from its narrow bore y may extend over, for example, about a fifth of the length of the tube 12 in zone A in a typical example.

The expanded gas flow 37 and the constricted gas flow 38 from these outlets mix together in a mixing zone B between the first zone A and the reaction zone C. This mixing zone B has a larger cross-sectional area (diameter d) than that of the outlet (diameter x) of the capsule 2 and that of the reaction zone C over the substrate 29; thus, the flows 37 and 38 expand into the zone B before being constricted in the zone C.

From the zone B, the mixed gas stream 36 flows through the reaction zone C between a lower major surface formed by a heated susceptor 5 (having the substrate 29 thereon) and an upper major surface formed by the flat upper wall 41 of the reactor vessel 1. The susceptor 5 may be of semi-cylindrical graphite resting on the bottom of the tube 1 and may be radiantly heated by a resistively-heated semi-cylindrical furnace, as described in GB-A-2 156 857. The semi-cylindrical furnace 6 (FIG. 2) comprises a ceramic semi-cylinder 8 provided on its inside surface with longitudinally extending channels 9, adjacent channels being interconnected at one end, and a helical wire resistance element 10 being disposed in the channels 9.

A fourth zone D may be present at the end of the reaction zone C. This zone D is unheated during the deposition of the layer material on the substrate 29 and may contain a closely fitting silica liner 7 which serves as a "dump-tube" on which reaction by-products are deposited. The silica liner 7 simplifies the problem of cleaning the reaction vessel 1 after a deposition run. Material deposited in the growth zone C on the wall of the vessel 1 can be transferred onto the internal surface of the liner 7 by placing a tubular furnace around the growth zone C of the vessel 1, passing a hydrogen stream through the vessel 1 (from left to right in FIG. 1) and heating the zone C to a temperature which is 300 to 400 Celsius degrees above the temperature prevailing in the reaction zone C during the deposition process.

When depositing material for a layer 30 of cadmium mercury telluride, alkyls of cadmium and tellurium are preferably used as the volatile compound. Thus, for example, diethyl telluride and dimethyl cadmium may be introduced into the reactor vessel 1 in the form of currents of hydrogen and diethyl telluride vapour and of hydrogen and dimethyl cadmium vapour through the respective tubes 11 and 12. FIG. 1 diagrammatically shows one example of a gas supply system such as disclosed in GB-A-2 156 857. Palladium-diffused hydrogen is supplied to each of four mass flow controllers 13, 14, 15 and 16. The diethyl telluride vapour is generated by passing hydrogen through the mass flow controller 14, a three-way solenoid valve 17 and a non-return valve 18 to a bubbler 19 containing diethyl telluride liquid. The mixture of the hydrogen and diethyl telluride vapour produced in the bubbler 19 flows through a three-way solenoid valve 20 and is then diluted with hydrogen supplied through the mass flow controller 13, the resulting mixture entering the vessel 1 through the tube 11 which terminates at the inlet to the capsule 2. The gas stream 38 entering the vessel 1 through the tube 11 entrains mercury vapour generated from the mercury 3 present in the capsule 2 which is heated by the tubular furnace 4 to a temperature of from 220° to 250° C.

The hydrogen streams from the mass flow controllers 15 and 16 pass through respective three-way solenoid valves 21 and 22. When the solenoid valve 21 is in a first position, the hydrogen flow through the valve 21 passes through a non-return valve 23 to a bubbler 24 containing dimethyl cadmium, and the current of hydrogen and dimethyl cadmium vapour passes through a three-way solenoid valve 25 in a first position to the tube 12. When the three-way solenoid valve 21 is in a second position, the valve 25 is also in a second position and then the hydrogen stream from the mass flow controller 15 bypasses the bubbler 24. The hydrogen stream from the mass flow controller 16 passes through the three-way solenoid valve 22 either through a non-return valve 26 to a bubbler 27 containing a volatile dopant and to a three-way solenoid valve 28, or directly to the three-way solenoid valve 28. The currents from the valves 25 and 28 are combined and enter the reactor vessel 1 through the tube 12. The bubblers 19, 24 and 27 are each kept at, for example, 25° C. by means of a water bath (not shown) in order to keep the vapour pressures of the respective alkyls constant.

In one specific example, the tubes connecting the three-way solenoid valves 25 and 28 to the tube 12 and the narrow bore y of tube 12 have an internal diameter of about 1 to 2 mm, and the length of tube from the valves 25 and 28 to the discharge end of the tube 12 in the vessel 1 may be about 150 cm. Hydrogen is passed through the diethyl telluride bubbler 19 at a rate of, for example, 200 to 2000 ml per minute, and hydrogen is passed through the dimethyl cadmium bubbler 24 at a rate of, for example, 20 to 200 ml per minute, and hydrogen may be passed at a similar rate of, for example, 30 to 300 ml per minute through the three-way solenoid valve 22 associated with the dopant bubbler 27. The transit times of the gas streams from the three-way solenoid valves 25 and 28 to the outlet end of the tube 12 in the vessel 1 are of the order of a second or so. The outlets of the capsule 2 and of the tube 12 are dimensioned and positioned so as to achieve complete mixing of the gas currents before reaching the substrate 29. The dimethyl cadmium and diethyl telluride decompose to form cadmium and tellurium which react with mercury vapour to form a cadmium mercury telluride ($Cd_xHg_{1-x}Te$) layer 30 on the substrate 29 which may be maintained at, for example, 390° to 410° C. The gaseous reaction products hydrogen and unreacted material pass out of the vessel 1 through an exit tube 31. Preferably the cadmium supply from the bubbler 24 is switched periodically on and off during the deposition of the layer 30 in order to grow very thin alternate layers of cadmium telluride and mercury telluride which interdiffuse while growing on the heated substrate 29 to form a homogenous layer 30 of cadmium mercury telluride in accordance with the teaching in published United Kingdom patent application GB-A-2 146 663.

The applicants have found that very homogeneous layers of cadmium mercury telluride can be grown in this manner with the outlet configuration of the mercury capsule 2 and cadmium alkyl injection tube 12 illustrated in FIGS. 1 and 2, instead of the injection tube configuration illustrated in GB-A-2 156 857. This appears to result from a closer matching of the velocity of the gas flow 37 with that of the gas flow 38 as they enter the mixing zone B. Thus, for example, numerical calculations show that when the gas flows (in liters per minute) for the streams 38 in zone A and 37 in injection tube 12 are in a ratio of about 10 to 1, the gas flows 37 and 38 emerge into the mixing zone B with velocities in the following ratios for the following situations (i) to (iii):

|  | Stream 38 outlet diameter | Stream 37 outlet diameter | 37:38 Velocity Ratio |
|---|---|---|---|
| (i) | d; 40 mm. | y; 1 mm. | more than 100 to 1 |
| (ii) | a; 18 mm. | y; 1 mm. | about 30 to 1 |
| (iii) | a; 18 mm. | x; 5 mm. | about 1 to 1. |

The outlet diameter given for stream 38 is the total diameter and so includes the concentric area of the tube 12 which needs to be subtracted to obtain the actual area through which stream 38 flows around the outlet of tube 12. Situation (i) corresponds to that illustrated in GB-A-2 156 857 with a uniform tube 12 and with a conventional mercury boat instead of the mercury capsule 2. Situation (ii) corresponds to the inclusion of a mercury capsule 2 (with outlet diameter of 18 mm) but with a uniform tube 12 of narrow bore (1 mm). Situation (iii) corresponds to an arrangement in accordance with the invention in which the tube 12 widens to a diameter of about 5 mm (from 1 mm) at the narrowed outlet (about 18 mm) of a capsule 2.

Although a velocity ratio of about 1 to 1 is given above for situation (iii), a less close matching may be used in embodiments of the present invention, but preferably at most for example 2 to 1, or 3 to 1. However, in order to complete the mixing and to stabilize the gas flows and reactant compositions before growth of the layer 30, the wide outlet of the injection tube is preferably spaced from the heated substrate 29 by a distance L of at least 2 times the average cross-sectional dimension d (e.g. 40 mm in a specific example) of the vessel 1 at the location of the outlet and in the mixing zone B.

In these circumstances for the specific example described above for cadmium mercury telluride growth in accordance with the invention, it has been found possible using this method to produce crystalline $Cd_xHg_{1-x}Te$ layers at a rate of 10 μm/hour with values of x ranging from 0.15 to 0.45, for example 0.22. With a specific composition in this range, the value of x typically varied laterally across the area of the layer 30 by less than 2% for 10 μm thick layers on a substrate length of 1 cm.

In addition to the good mixing of a volatile cadmium compound from the injection tube 12, the invention permits good mixing of a dopant from the tube 12. Thus, for example, the bubbler 27 may contain an alkyl of the dopant, for example trimethyl aluminium, fed to the injection tube 12. When a structure is desired consisting of cadmium mercury telluride layers with different dopants or doped to different extents, an additional mass flow controller, bubbler and the associated valves can be used. In addition to, or instead of, the dopant bubbler 27, a gaseous dopant (for example arsine or phosphine in hydrogen) may be supplied from a compressed gas cylinder to the reaction zone C via the injection tube 12.

After growing the layer 30 on the substrate 29, further device fabrication steps are effected in known manner, using at least part of this crystalline layer 30 of cadmium mercury telluride to provide a part of the electronic device. The device may be, for example, an infrared detector or a transistor. Some of these further steps may be effected in the same reactor vessel 1 as the growth of the layer 30. Thus, for example, a thick passivating layer of CdTe may be deposited on the layer 30. However, most of the further device fabrication steps are performed outside the reactor vessel 1, for example patterning the layer 30 into a desired shape for a device element, depositing metal electrodes contacting the cadmium mercury telluride, and perhaps p-n junction formation in the cadmium mercury telluride layer 30. The further processing may also be effected on the substrate 29, for example by shaping the substrate 29 to form an appropriate optical element for the device.

It will be evident that many modifications are possible within the scope of the invention, thus, for example at least most of the reactor vessel 1 may have a flat top wall 41 as illustrated in FIG. 3 and non-circular geometries can be used for the outlet of the capsule 2 and the injection tube 12. In FIG. 3, the injection tube widens mostly in the horizontal dimension x (and very little in the vertical z direction) from a narrow bore to a wider outlet, this one wider dimension x being substantially parallel to the flat upper wall 41 of the vessel 1. The outlet of the mercury capsule 2 may be of a similar non-circular geometry. Furthermore with some reactor vessel geometries it may be sufficient to have the widening injection tube (from y to x) without having the narrowed outlet of a mercury capsule 2; thus, for example, in such a case a conventional mercury boat may be used.

In a particularly attractive modification the invention is incorporated into a method involving photolytic decomposition of volatile Cd and Te compounds as described in published PCT international patent application WO-A-86/02951. This permits the use of substrate temperatures in the range of, for example, 220° C. to 270° C. The equipment has a lamp or other means for producing the ultra-violet or other light radiation used to decompose the Cd and Te compounds. In this case, the gas stream 36 over the substrate 29 comprises an inert gas or gases, for example nitrogen or a noble gas such as helium.

Although particularly advantageous for the growth of cadmium mercury telluride layers 30, the invention may also be used in the deposition of layers of other materials, for example other ternary materials such as lead tin telluride, and in the doping of other materials, for example dopants for gallium arsenide and other binary semiconductor materials may be supplied via an injection tube arrangement in accordance with the present invention, for incorporation in a layer during deposition. The first zone may comprise a source of one of the reactants for the deposited layer, and this source may be in, for example, a liquid or molten form or even in some cases in a solid form, depending on the particular reactant. When the grown layer is deposited by passing only first and second reactants in a gas stream over the substrate, the first reactant may be supplied to the reactor by means of the injection tube, and the second reactant may be present in the first zone of the vessel and may be supplied to the reaction zone by passing a gas stream through the first zone.

From reading the present disclosure, other modifications will be apparent to persons skilled in the art. Such modifications may involve other features which are already known in the design, manufacture and use of reactor vessel systems and electronic devices, and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A reactor vessel for forming a solid state electronic device comprising
   (a) a reaction zone laterally separated from a first zone,
   (b) support means for supporting a substrate in said reaction zone,
   (c) heating means for heating both said first zone and said reaction zone,
   (d) first supply means for supplying at least one first reactant into a gas stream flowing from said first zone to said reaction zone, and
   (e) second supply means for supplying at least one second reactant into said gas stream between said first zone and said reaction zone, said second supply means including an injection tube extending through said first zone to a location between said first zone and said reaction zone, said injection tube having a narrow bore to pass said at least one second reactant through said first zone at a first flow velocity, and said injection tube having outlet end widening in at least one dimension to provide said at least one second reactant at a second lower flow velocity into said gas stream, said outlet end beginning said at least one widening dimension at a position of said injection tube before an end facing said substrate and extending to said facing end, said second lower flow velocity more closely matching a flow velocity of said gas stream,
   wherein said substrate receives a layer formed from said reactants in a solid compound.

2. A reactor vessel according to claim 1, wherein a capsule containing a source of at least one further reactant is disposed in said first zone, said capsule concentrically surrounding said injection tube, and said capsule passing said gas stream.

3. A reactor vessel according to claim 2, wherein said layer formed from said reactants is cadmium mercury telluride.

4. A reactor vessel according to claim 1, wherein said outlet end is disposed at a distance from said substrate of at least 2 times a cross-sectional dimension of said reactor vessel at said outlet end.

5. A reactor vessel according to claim 1, wherein said outlet begins widening from said narrow bore at a point being about one fifth of a length of said injection tube from said facing end of said injection tube.

6. A reactor vessel according to claim 1, wherein said outlet end widens in substantially three dimensions.

7. A reactor vessel according to claim 6, wherein said outlet end widens to a diameter of about 5 mm, and wherein said narrow bore has a diameter of about 1 mm.

8. A reactor vessel according to claim 2, wherein said outlet end widens in substantially three dimensions.

9. A reactor vessel according to claim 8, wherein said outlet end widens to a diameter of about 5 mm, wherein said narrow bore has a diameter of about 1 mm, and wherein said capsule has a narrowed outlet surrounding said outlet end, said narrowed outlet of said capsule having a diameter of about 18 mm.

* * * * *